United States Patent [19]

Kashimura

[11] Patent Number: 5,058,072
[45] Date of Patent: Oct. 15, 1991

[54] SEMICONDUCTOR MEMORY DEVICE WITH HIGH SPEED SENSING FACILITY

[75] Inventor: Masahiko Kashimura, Tokyo, Japan

[73] Assignee: NEC Corporation, Tokyo, Japan

[21] Appl. No.: 359,907

[22] Filed: Jun. 1, 1989

[30] Foreign Application Priority Data

Jun. 1, 1988 [JP] Japan .................. 63-135862

[51] Int. Cl.$^5$ .......................................... G11C 11/409
[52] U.S. Cl. ............................. 365/203; 365/189.06; 365/189.11; 365/205; 365/208; 307/475
[58] Field of Search .................. 365/190, 189.11, 205, 365/207, 208, 189.06, 203; 307/475

[56] References Cited

U.S. PATENT DOCUMENTS

| | | | |
|---|---|---|---|
| 3,983,543 | 9/1976 | Cordaro | 307/475 |
| 4,163,907 | 8/1979 | Schroeder et al. | 307/475 |
| 4,300,213 | 11/1981 | Tanimura et al. | 365/190 |
| 4,365,316 | 12/1982 | Iwahashi et al. | 307/475 |
| 4,616,342 | 10/1986 | Miyamoto | 365/190 |
| 4,800,303 | 1/1989 | Graham et al. | 307/475 |

FOREIGN PATENT DOCUMENTS 58-189898  11/1983  Japan .................. 365/205

Primary Examiner—Joseph E. Clawson, Jr.
Attorney, Agent, or Firm—Sughrue, Mion, Zinn, Macpeak & Seas

[57] ABSTRACT

A semiconductor memory device according to the present invention has a plurality of memory cells, a pair of data lines propagating the data bit, a data transfer unit responsive to address bits and operative to read out the data bit from one of the memory cells for providing the difference in voltage level between the data lines, a sense amplifier circuit having a pair of nodes and operative to increase the difference in voltage level by discharging one of the nodes, and a blocking circuit coupled between the data lines and the nodes and operative to relay the difference in voltage level between the data lines to said nodes, respectively, and the blocking circuit is further operative to isolate one of the nodes from associated data line when the node is discharged, so that the capacitive load applied to the sense amplifier circuit is drastically decreased so as to speed up the read-out operation.

3 Claims, 8 Drawing Sheets

SEMICONDUCTOR MEMORY DEVICE WITH HIGH SPEED SENSING FACILITY

FIELD OF THE INVENTION

This invention relates to a semiconductor memory device and, more particularly, to a sense amplifier circuit incorporated in the semiconductor memory device.

DESCRIPTION OF THE RELATED ART

A typical example of the semiconductor memory device is illustrated in FIG. 1 and largely comprises a memory cell array 1 having a plurality of memory cells arranged in rows and columns, a plurality of digit line pairs 2 and 3 provided in association with the plural columns of the memory cells, respectively, a plurality of word lines 4, 5, 6 and 7 coupled to the rows of the memory cells, respectively, a row address decoder-and-buffer circuit 8 selectively activating the word lines 4 to 7, a precharging circuit 9 coupled between a source of positive voltage Vcc and the bit line pairs 2 and 3, a sense amplifier circuit 10 coupled to a data line pair 11, a bit line selector circuit 12 coupled between the bit line pairs 2 and 3 and the data line pair 11 for electrically conducting one of the bit line pairs to the data line pair, a column address decoder-and-buffer circuit 13 for shifting the bit line selector circuit 12, a data output buffer circuit 14-1 coupled to the data line pair 11, and a data input buffer circuit 14-2 also coupled to the data line pair 11.

Although only two memory cells M11 and M21 are shown in the figure and associated with the respective bit line pairs 2 and 3, a plurality of memory cells are coupled to each of the bit line pair. The memory cells are of the static type, and a typical example of the static memory cell is illustrated in FIG. 2. The memory cell shown in FIG. 2 is constituted by a combination of two complementary inverter circuits 15 and 16 each coupled between the source of positive voltage Vcc and the ground and two n-channel type field effect transistors 17 and 18, and the two n-channel type field effect transistors 17 and 18 are simultaneously gated by a word line such as the word line 4. The two complementary inverter circuits 15 and 16 form in combination a flip-flop circuit, and a data bit is memorized in the static memory cell in the form of a difference in voltage level between the respective output nodes 19 and 20 of the complementary inverter circuits 15 and 16. When the two n-channel type field effect transistors 17 and 18 turn on with an active high voltage level, a bit line pair such as the bit lines pair 2 is electrically conducted to the output nodes 19 and 20 of the complementary inverter circuits 15 and 16. Then, the data bit is read out from the static memory cell to the bit line pair 2 in the readout mode of operation, and a new data bit is written into the static memory cell in the form of the difference in voltage level between the output nodes 19 and 20 in the write-in mode of operation. The static memory cell shown in FIG. 2 has the two complementary inverter circuits 15 and 16, i.e., two series combinations of the p-channel type field effect transistors and the n-channel type field effect transistors for memorization of the data bit. However, the two complementary inverter circuits 15 and 16 are replaceable with two series combinations of resistors 21 and 22 and two n-channel type field effect transistors 23 and 24 as shown in FIG. 3. The other components are similar to those of the static memory cell shown in FIG. 2, so that they are designated by like reference numerals without detailed description.

Turning back to FIG. 1, the row address decoder-and-buffer circuit 8 comprises a plurality of NAND gates (only one of which is shown in FIG. 1) and a plurality of NOR gates (one of which is also shown in the figure), and a multi-bit row address signal RA is supplied to the NAND gates through inverter circuits (not shown) selectively accompanying the NAND gates, so that only one NAND gate produces an output signal of the ground voltage level depending upon the bit string of the address signal. The NOR gates are simultaneously supplied with the complementary signal of a precharging signal from an inverter circuit 25 coupled at the input node thereof to a precharging line 26. The precharging line 26 propagates the precharging signal PC of an active low voltage level. The other input nodes of the NOR gates are coupled to the output nodes of the NAND gates, respectively, and, for this reason, one of the NOR gates allows one of the word lines to go up to the positive high voltage level Vcc in the absence of the precharging signal PC.

The precharging circuit 9 has a plurality of p-channel type field effect transistors coupled between the source of positive voltage level Vcc and the bit lines 2 and 3, and these p-channel type field effect transistors are simultaneously gated by the precharging line 26. The bit line selector circuit 12 has a plurality of transfer gates associated with inverters coupled in parallel between the bit lines 2 and 3 and the data line pair 11, and these transfer gates associated with inverters selectively turn on by the function of the column address decoder-and-buffer circuit 13 for relaying only one data bit to the sense amplifier circuit 10.

The sense amplifier circuit 10 is constituted by two complementary inverter circuits 27 and 28 and an n-channel type field effect transistor 29, and the output nodes 30 and 31 of the complementary inverter circuits 27 and 28 are respectively coupled to the data line pair 11. The complementary inverter circuits 27 and 28 are coupled between the source of positive voltage level Vcc and the ground in a parallel manner, and the complementary inverter circuits 27 and 28 are respectively gated by the output nodes 31 and 30, so that a small difference in voltage level on the data line pair 11 is increased by the sense amplifier circuit 10. For activation of the sense amplifier circuit 10, the n-channel type field effect transistor 29 is provided between the two complementary inverter circuits 27 and 28 and the ground and gated by sensing signal line 32 where a sense enable signal SE of the active high voltage level appears.

Description is made for the read-out operation with reference to FIG. 4. Assuming now that the memory cell M11 is accessed from the outside of the semiconductor memory device, the precharging signal PC goes down to the active low voltage level at time t0, and, accordingly, the inverter circuit 25 allows the row address decoder-and-buffer circuit 8 to shift all of the word lines into the inactive low voltage level. With the active low voltage level, the precharging circuit 9 provides conduction paths between the source of positive voltage level Vcc and all of the bit line pairs 2 and 3, so that the bit line pairs 2 and 3 as well as the data line pair 11 are fully accumulated with electric charges and, accordingly, go up to the positive high voltage level until time t1. The accumulation of the bit line pairs and the data line pair mean that parasitic capacitances Cb and Cd are accumulated with the electric charges. However, the sensing signal line 32 remains in the inactive low voltage level at time t1, and, for this reason, no differential amplification takes place for a data bit on the data line pair 11.

The row address signal RA and the column address signal CA respectively reach the row address decoder-and-buffer circuit 8 and the column address decoder-and-buffer circuit 13 until time t2, and the precharging signal line 26 is recovered to the inactive high voltage level at time t2. The precharging circuit 9 blocks the conduction paths between the source of positive voltage level Vcc and the bit line pairs 2 and 3, and the word line 4 goes up to the positive high voltage level for allowing the data bit in the memory cell M11 to appear on the bit line pair 2. A small difference in voltage level takes place between the bit lines 2 and is transferred to the data line pair 11, because the bit line selecting circuit 12 selectively shift the transfer gates with the inverter circuits into the on-states for providing the conduction path between the bit line pair 2 and the data line pair 11. If the data bit read out from the memory cell M11 is logic "1" level, the output nodes 19 and 20 have been in the positive high voltage level and in the ground level, respectively. When the word line 4 of the positive high voltage level causes the n-channel type field effect transistors 17 and 18 to turn on, the parasitic capacitances Cb and Cd coupled to the output node 20 are discharged from one of the data lines and one of the bit lines through the n-channel type field effect transistors 18 to the ground, and, for this reason, the out put node 31 is decreased in voltage level toward the ground level.

The sensing signal line 32 goes up to the positive high voltage level at time t3, and, accordingly, the sense amplifier circuit 10 is activated for the differential amplification. Since a small difference in voltage level has already taken place on the data line pair 11, the output node 31 is grounded through the n-channel type field effect transistors 29. Since the output node 31 is thus further grounded, the voltage descend slightly speeds up toward the ground level, and a large difference in voltage level takes place on the data line pair 11 around time t3. The large difference in voltage level is supplied to the data output buffer circuit 14-1 and read out as the data bit stored in the memory cell M11.

In the write-in operation, a data bit is supplied to the data input buffer circuit 14-2, and the data input data buffer circuit 14-2 provides a large difference in voltage level representative of the logic level of the data bit on the data line pair 11. The bit line selecting circuit 12 relays the large difference in voltage level to one of the bit line pairs, and the large difference in voltage level cause the output nodes of one of the memory cells to remain or change in voltage level for memorization of the data bit.

The static type semiconductor memory device is increasing in the number of the memory cells, and, accordingly, each of the bit line pairs is shared by a large number of the memory cells. This tendency increases the amount of the parasitic capacitances Cb and Cd driven by the sense amplifier circuit 10. This results in that one of the output nodes of the sense amplifier circuit 10 slowly decreases in voltage level, and, accordingly, a prolonged time period is consumed for the differential amplification. Thus, a problem is encountered in the prior art semiconductor memory device in read-out operation.

SUMMARY OF THE INVENTION

It is therefore an important object of the present invention to provide a semiconductor memory device which is increased in the number of the memory cells without any sacrifice of the operation speed.

It is also an important object of the present invention to provide a semiconductor memory device which is improved in time consumption for the read-out operation.

To accomplish these objects, the present invention proposes to isolate the sense amplifier circuit from the data lines upon differential amplification.

In accordance with one aspect of the present invention, there is provided a semiconductor memory device comprising a) a plurality of memory cells each storing a data bit in the form of a difference in voltage level, b) a pair of data lines propagating the data bit, c) data transfer means responsive to address bits and operative to read out the data bit from one of said memory cells for providing the difference in voltage level between said data lines, d) a sense amplifier circuit having a pair of nodes and operative to increase the difference in voltage level by discharging one of the nodes, and e) blocking means coupled between said data lines and said nodes and operative to relay the difference in voltage level between the data lines to said nodes, respectively, said blocking means further being operative to isolate one of said nodes from associated one of said data lines when aforesaid one of the nodes is discharged.

In accordance with another aspect of the present invention, there is provided a semiconductor memory device comprising a) a plurality of memory cells each storing a data bit in the form of a difference in voltage level, b) a pair of data lines propagating the data bit, c) addressing means for coupling one of said memory cells to said data lines, d) a sense amplifier circuit having a pair of nodes, and e) first and second field effect transistors respectively coupled between said data lines and said nodes, wherein said first and second field effect transistors respectively have gate electrodes coupled to said associated data lines, respectively, or to a source of constant voltage level.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First embodiment

Figure 1:
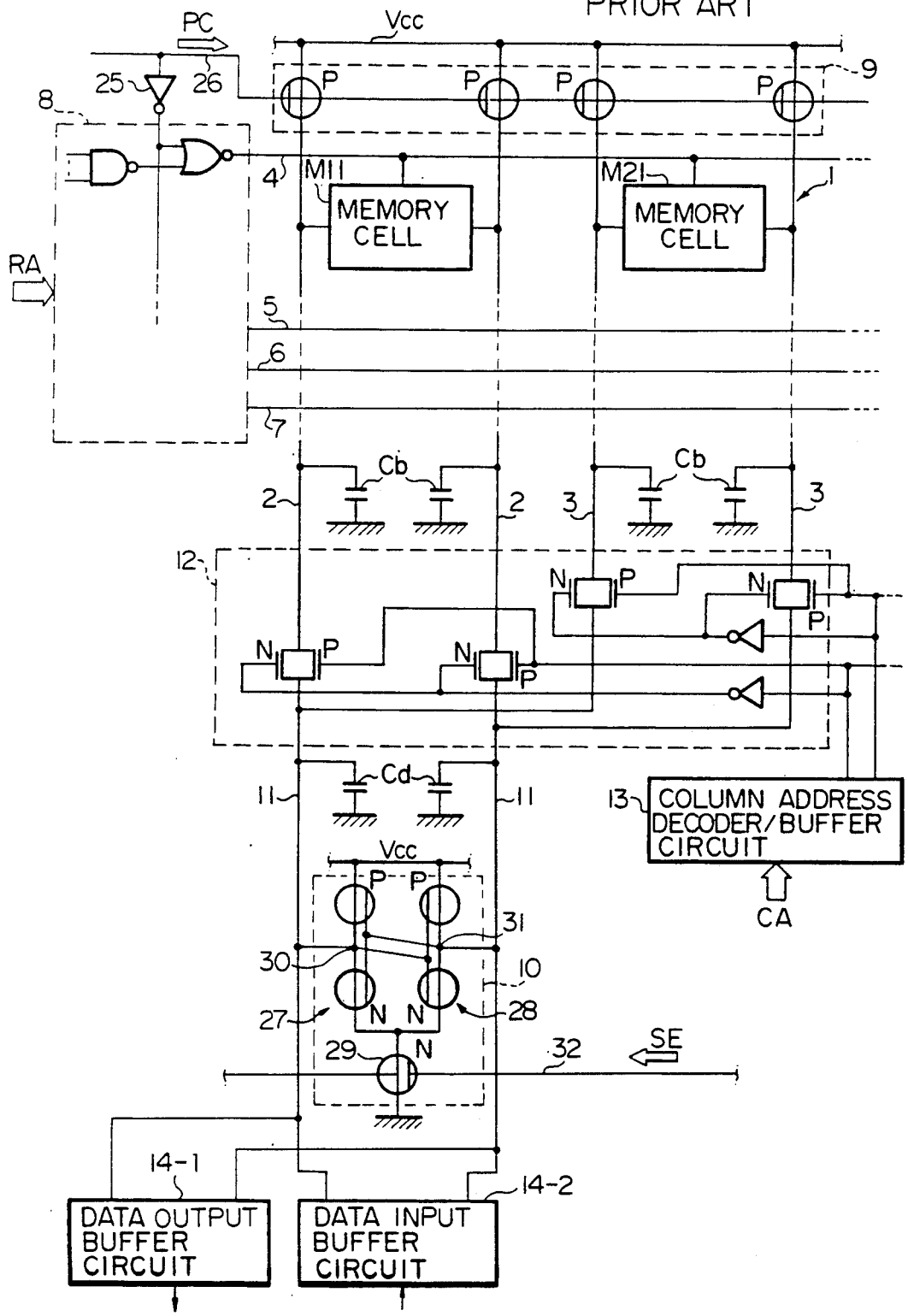
FIG. 1 is a circuit diagram showing the arrangement of a prior art static type semiconductor memory device.
Figure 2:
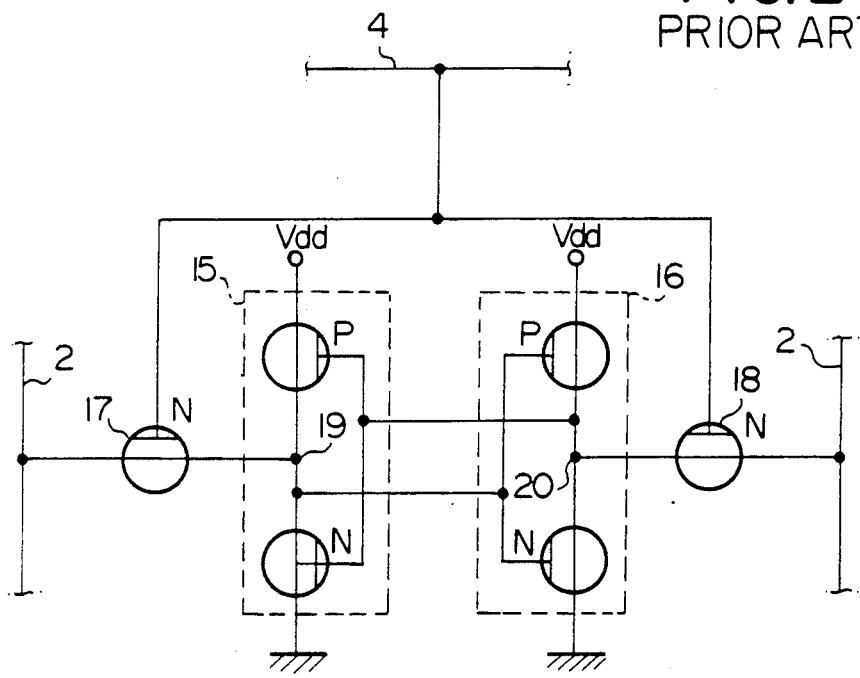
FIG. 2 is a circuit diagram showing the circuit arrangement of the memory cell incorporated in the semiconductor memory device shown in FIG. 1.
Figure 3:
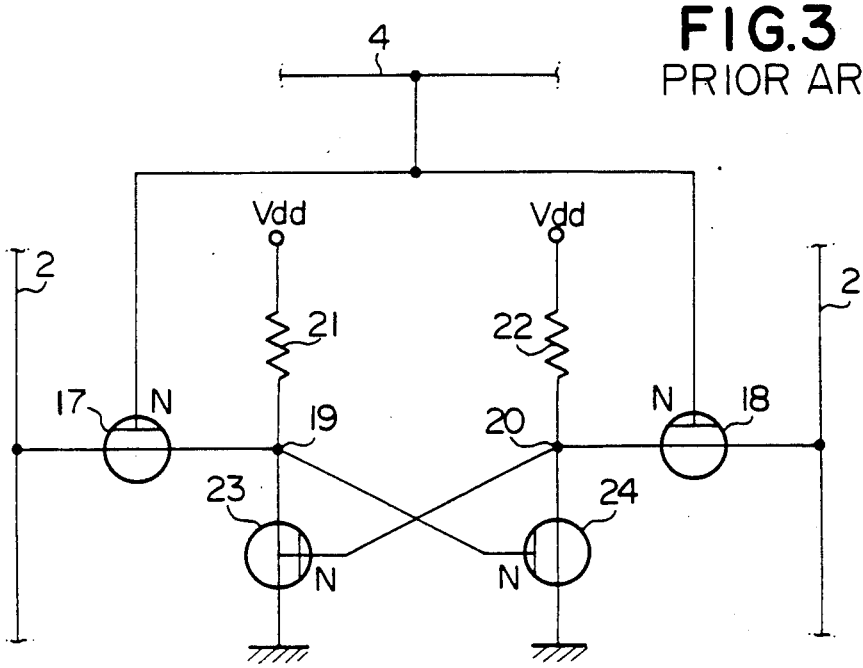
FIG. 3 is a circuit diagram showing the circuit arrangement of another memory cell well known in the art.
Figure 5:
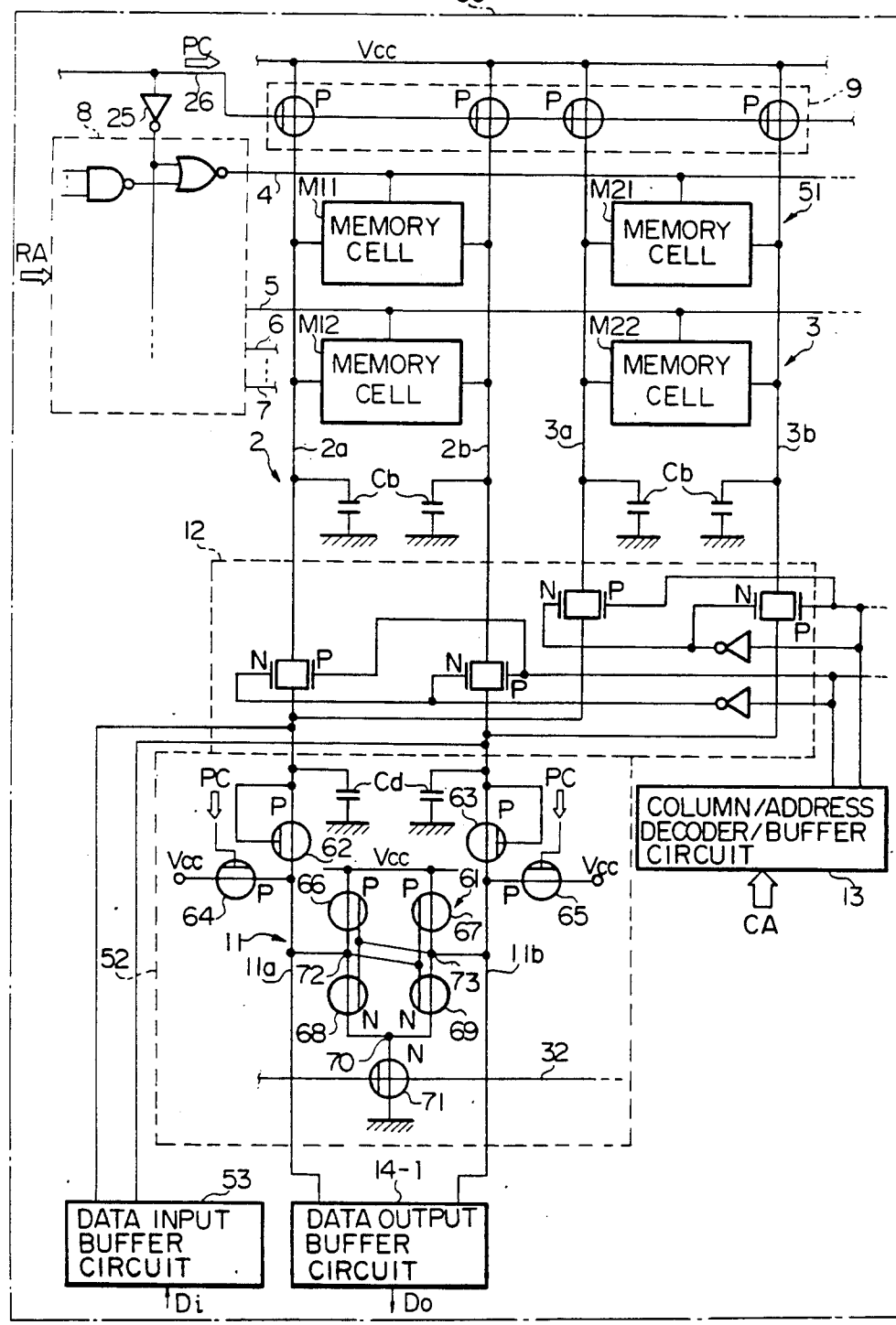
FIG. 5 is a circuit diagram showing the arrangement of a semiconductor memory device embodying the present invention.

Referring first to FIG. 5 of the drawings, a semiconductor memory device is fabricated on a semiconductor substrate 50 and largely comprises a memory cell array 51 arranged in rows and columns, an addressing facility, a sensing facility 52, and a temporary data storage facility. However, the semiconductor memory device is similar in arrangement to that shown in FIG. 1 except for the arrangement of the sensing facility 52 and the connection of a data input buffer circuit 53, so that corresponding circuits are denoted by like reference numerals used in FIG. 1 without any detailed description. The memory cell array 51 has a large number of the memory cells, however, FIG. 5 shows four memory cells labeled by M11, M12, M21 and M22. The bit line pairs 2 and 3 consist of the bit lines 2a and 2b and the bit lines 3a and 3b, respectively, and the data line pair 11 similarly consists of data lines 11a and 11b.

The sensing facility comprises a sense amplifier circuit 61, blocking transistors 62 and 63 auxiliary precharging transistors 64 and 65, and the sense amplifier circuit 61 has two series combinations of p-channel field effect transistors 68 and 69 and n-channel field effect transistors 68 and 69 coupled in parallel between the source of positive voltage level Vcc and a common source node 70 and an activation transistor 71 coupled between the common source node 70 and the ground node. Input nodes 72 and 73 are provided between the two p-channel type field effect transistors 66 an 67 and the two n-channel type field effect transistors 68 and 69, respectively. The blocking transistors 62 and 63 are formed by p-channel type field effect transistors which have a threshold value of about zero. The gate electrodes of these p-channel type field effect transistors are coupled to the data line pair on the side of the bit line selecting circuit 12, so that the p-channel type field effect transistors serve as diodes which have the respective cathodes coupled to the bit line selecting circuit 12. The auxiliary precharging transistors 64 and 65 are also formed by two p-channel field effect transistors coupled between the source of positive voltage level Vcc and the input-and-output nodes 72 and 73, respectively, and these p-channel type field effect transistors are gated by the precharging signal PC.

The data input buffer circuit 53 is coupled to the data line pair 11 between the bit line selecting circuit 12 and the blocking transistors 62 and 63.

Description is hereinbelow made for the read-out operation with reference to FIG. 6. Assuming now that the memory cell M11 is accessed from the outside and that the data bit of logic "1" level is memorized in the memory cell M11, the precharging line 26 goes up to the positive high voltage level at time t00 for precharging operation. All of the p-channel type field effect transistors of the precharging circuit 9 and the auxiliary precharging transistors 64 and 65 simultaneously turn on to allow the bit line pairs 2 and 3, the data line pair 11 and the input-and-output nodes 72 and 73 to go up to the positive high voltage level Vcc. Whereas, the complementary precharging signal of the high voltage level is supplied to the row address decoder-and-buffer circuit 8, and, accordingly, all of the word lines 4 to 7 remains in the inactive low voltage level. By the way, since the sensing signal line 32 is in the inactive low voltage level, the sense amplifier circuit 61 does not start on the differential amplification. While the bit line pairs and so forth are precharged, the row and column address signal specifying the memory cell M11 are respectively supplied to the row address decoder-and-buffer circuit 8 and the column address decoder-and-buffer circuit 13.

At time t10, the precharging signal PC is recovered to the inactive high voltage level, and, accordingly, all of the bit line pairs 2 and 3 are blocked from the source of positive voltage level Vcc. The row address decoder-and-buffer circuit 8 pulls the word line 4 up to the positive high voltage level Vcc on the basis of the row address signal RA, and the column address decoder-and-buffer circuit 13 causes the bit line selecting circuit 12 to couple the bit line pair 2 to the data line pair 11 depending upon the column address signal CA. Since the memory cell M11 memorizes the data bit of logic "1", the bit line 2b and, accordingly, the data line 11b are discharged through the memory cell M11 to the ground, however, no variation takes place on the bit line 2a and the data line 11a. The parasitic capacitances Cb and Cd are too large to rapidly discharge through the small component transistors of the memory cell M11, so that only a small difference in voltage level takes place between the bit lines 2a and 2b and, accordingly, between the input-and-output nodes 72 and 73. This gradual decrements in voltage level are seen from the gentle sloops in FIG. 6. The blocking transistors 62 and 63 have the threshold voltage of about zero, so that the small difference between the bit lines 2a and 2b are relayed to the input-and-output nodes 72 and 73 without any substantial reduction.

At time t20, the sensing signal line 32 goes up to the active high voltage level Vcc, and the sense amplifier circuit 61 is activated to increase the small difference in voltage level between the input-and-output nodes 72 and 73. Then, the input-and-output node 73 is grounded through the n-channel type field effect transistors 69 and 71, and, accordingly, the input-and-output node 73 is slightly decreased in voltage level. This results in that the blocking transistor 63 is reversely biased to isolate the input-and-output node 73 from the data line 11b and, accordingly, from the parasitic capacitances Cb and Cd. Thus, the load capacitance is drastically decreased by cutting off the electrical conduction between the data line 11b and the input-and-output node 73, and, for this reason, the input-and-output node 73 reaches the ground level on the moment. The precharging signal PC goes down to the active low voltage level at time t30, so that the bit line pairs 2 and 3 and the data line pair 11 are precharged up again for the subsequent access.

Figure 4:
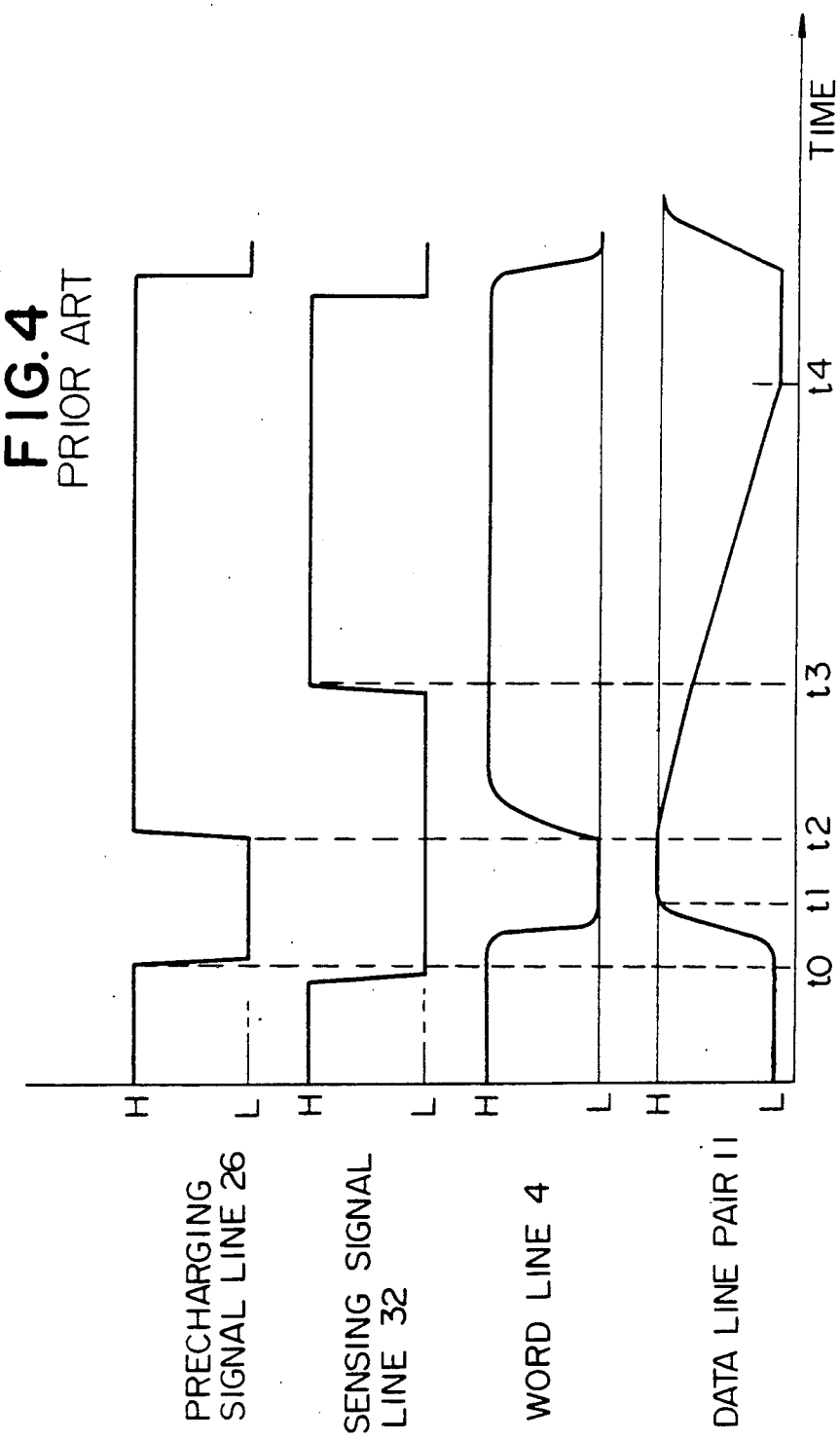
FIG. 4 is a diagram showing the waveforms of essential signals which are produced in the semiconductor memory device shown in FIG. 1.
Figure 6:
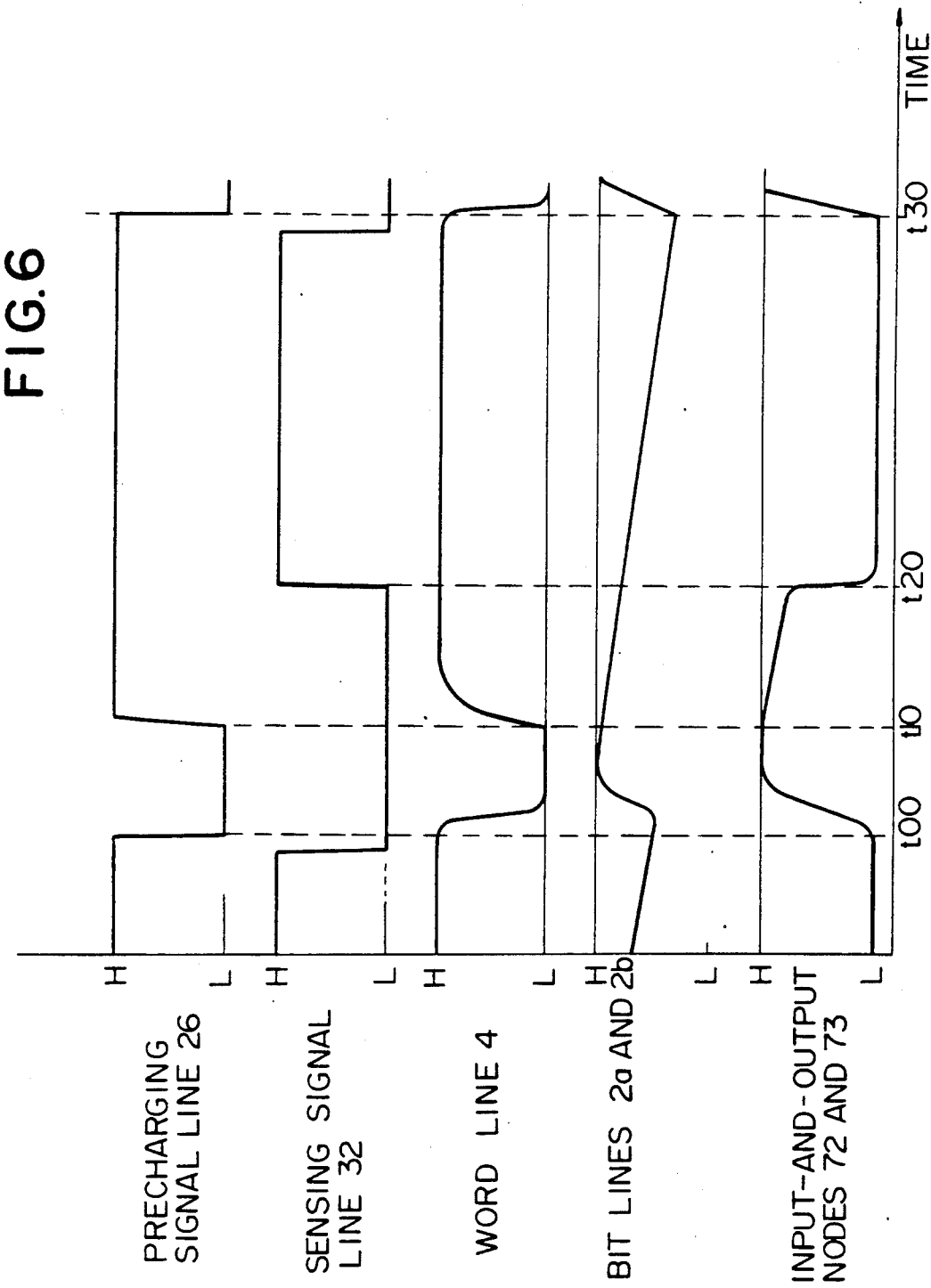
FIG. 6 is a diagram showing the waveforms of the essential signals in the semiconductor memory device shown in FIG. 5.

Comparing FIG. 6 with FIG. 4, it will be understood that the access time is decreased by virtue of the blocking transistors 62 and 63.

Second embodiment

Figure 7:
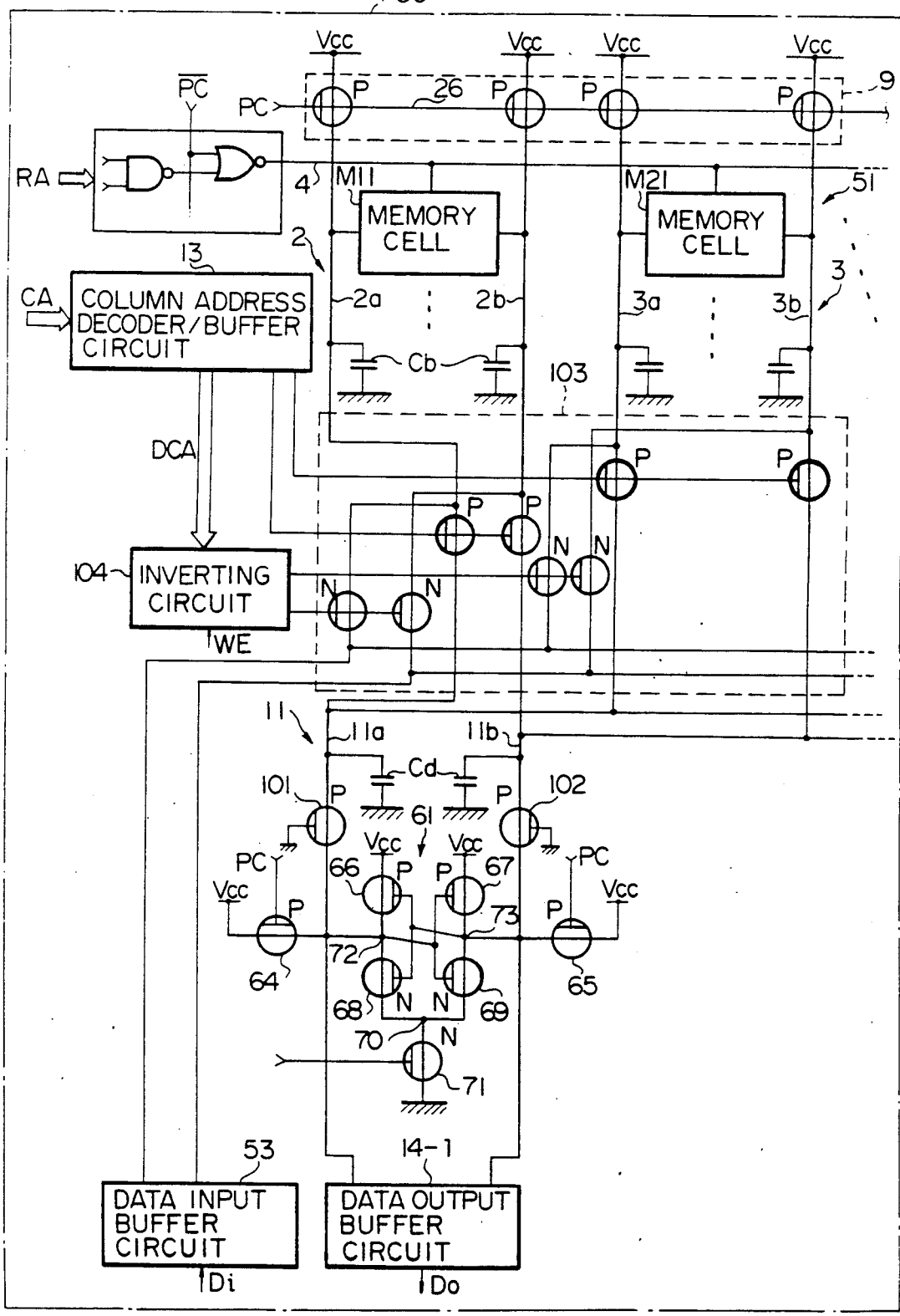
FIG. 7 is a circuit diagram showing the circuit arrangement of another semiconductor memory device embodying the present invention.
Figure 8:
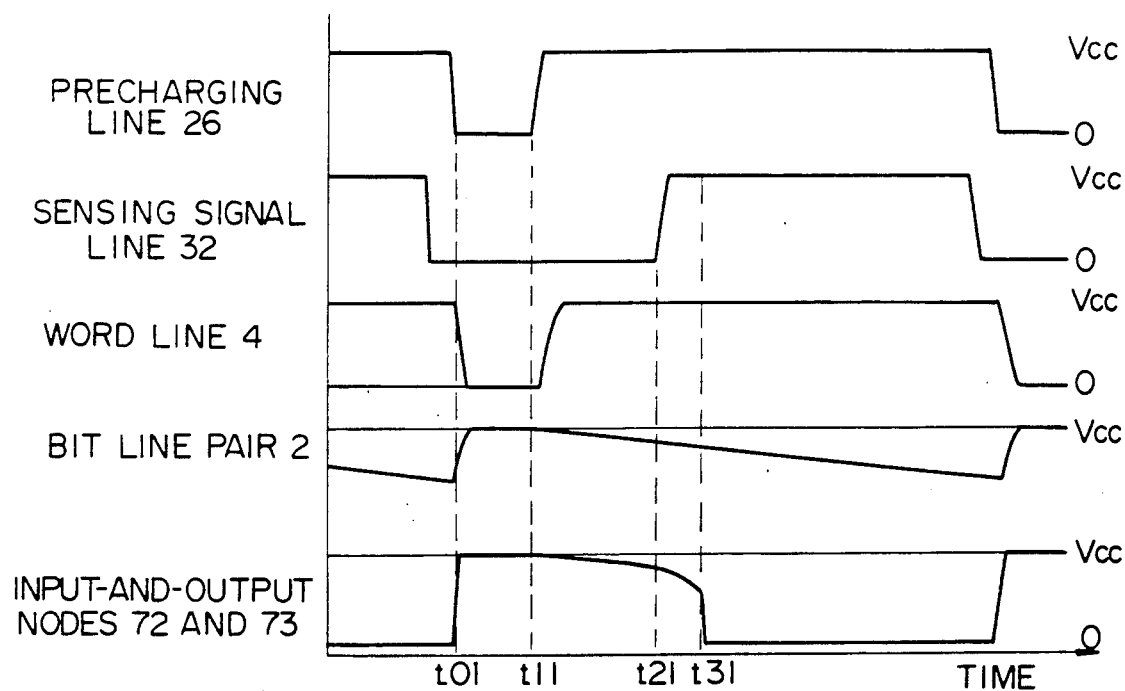
FIG. 8 is a showing the waveforms of the essential signals in the semiconductor memory device shown in FIG. 7.

Turning to FIG. 7 of the drawings, another semiconductor memory device embodying the present invention is similar to that shown in FIG. 5 with the exception of a blocking transistors 101 and 102 and a bit line selecting circuit 103 accompanied with an inverting circuit 104. For this reason, component circuits and transistors are denoted by like reference numerals, and no further description is hereinbelow incorporated for the sake of simplicity.

The data line pair 11 is dualized and dedicated to the data input buffer circuit 53 and the data output buffer circuit 14-1. Therefore, the bit line selecting circuit 103 has two sets of switching transistors coupled to the data input buffer circuit 53 and the data output buffer circuit 14-1, respectively, and one set of the switching transistors are of the p-channel type, but the other set of the switching transistors are of the n-channel type. The p-channel type field effect transistors of the bit line selecting circuit 103 are directly coupled to the column address decoder-and-buffer circuit 13, however, the n-channel type field effect transistors of the bit line selecting circuit 103 are coupled to the inverting circuit which in turn is coupled to the column address decoder-and-buffer circuit 13. The bit line selecting circuit 103 thus arranged changes the switching transistors between the reading-out mode of operation and the writing mode of operation for coupling one of the bit line pairs and the data line pair 11. In the bit line selecting circuit 103, the p-channel type field effect transistors are used to couple one of the bit line pairs to the data line pair 11, so that the p-channel type field effect transistors turn off to isolate the data line pair from the bit line pair and, accordingly, from the parasitic capacitance Cb when the source node thereof reaches about 3 volts. Thus, the data line pair 11 is blocked from the parasitic capacitance Cb, so that the capacitive load applied to the input-and-output node 72 or 73 is reduced, and the sense amplifier circuit 61 discharges the parasitic capacitance applied to the data line 11a or 11b. On the other hand, the n-channel type field effect transistors are used to relay an input data bit from the data line pair to the selected bit line pair. The inverting circuit 104 is activated by a write enable signal WE and allows one of the n-channel type field effect transistors to turn on with the complementary signal of the decoded column address signal. In this writing mode of operation, all of the p-channel type field effect transistors are supplied with the inactive high voltage level from the column address decoder-and-buffer circuit 13. However, all of the n-channel type field effect transistors are turned off with the inactive low voltage level from the inverting circuit 1.04

The blocking transistors 101 and 102 are formed by two p-channel type, enhancement-mode field effect transistors, and the gate electrodes of these transistors are coupled to the ground node. These p-channel type field effect transistors are as large in threshold voltage level as the other component p-channel type field effect transistors such as those of the precharging circuit 9. The semiconductor substrate 50 where the semiconductor memory device is fabricated is biased to the positive high voltage level Vcc.

In operation, the circuit behavior is similar to that of the semiconductor memory device shown in FIG. 5 until the sensing signal line 32 goes up to the active high voltage level Vcc. at time t21, and, for this reason, description is partially omitted for avoiding the repetition.

At time t21, the sensing signal line 32 goes up to the active high voltage level, the sense amplifier circuit 61 is activated for the differential amplification. Then, the input-and-output node 73 is grounded through the n-channel type field effect transistors 69 and 71, and the small difference between the data lines 11a and 11b is slightly increased.

In general, no back gate biassing phenomenon takes place in a field effect transistor in so far as the source node thereof is as large in voltage level as the semiconductor substrate where the field effect transistor is fabricated. However, since the input-and-output node 73 is decreased in voltage level, a difference of, for example, about 1 volt takes place between the source node of the field effect transistor 102 and the semiconductor substrate 50, and, accordingly, the threshold voltage level is increased by 1 volt by virtue of the back gate biasing phenomenon. If the threshold voltage level of the blocking transistor 102 is adjusted to about 1 volt without any influence of the back gate biasing phenomenon, and the positive voltage level Vcc is selected to be about 5 volts, the blocking transistor 102 turns off when the source node thereof reaches about 3 volts (at time t31). When the blocking transistor 102 is turned off, the input-and-output node 73 is electrically isolated from the data line 11b and, accordingly, from the parasitic capacitances Cb and Cd. As a result, the input-and-output node 73 rapidly reaches the ground level and different from the input-and-output node 72 by voltage value of about Vcc. The time period between times t11 and t31 may be slightly longer than the time period between times t10 and t20 but is surely shorter than the time period between times t3 and t4. Then, the access time is improved by the function of the blocking transistors 101 and 102.

The blocking transistors 101 and 102 are thus implemented by the p-channel type enhancement-mode field effect transistors with the gate electrodes coupled to the ground, and, for this reason, the blocking transistors 101 and 102 are easily feasible in comparison with the blocking transistors 62 and 63 with the threshold voltage level of about zero.

Third embodiment

Figure 10:
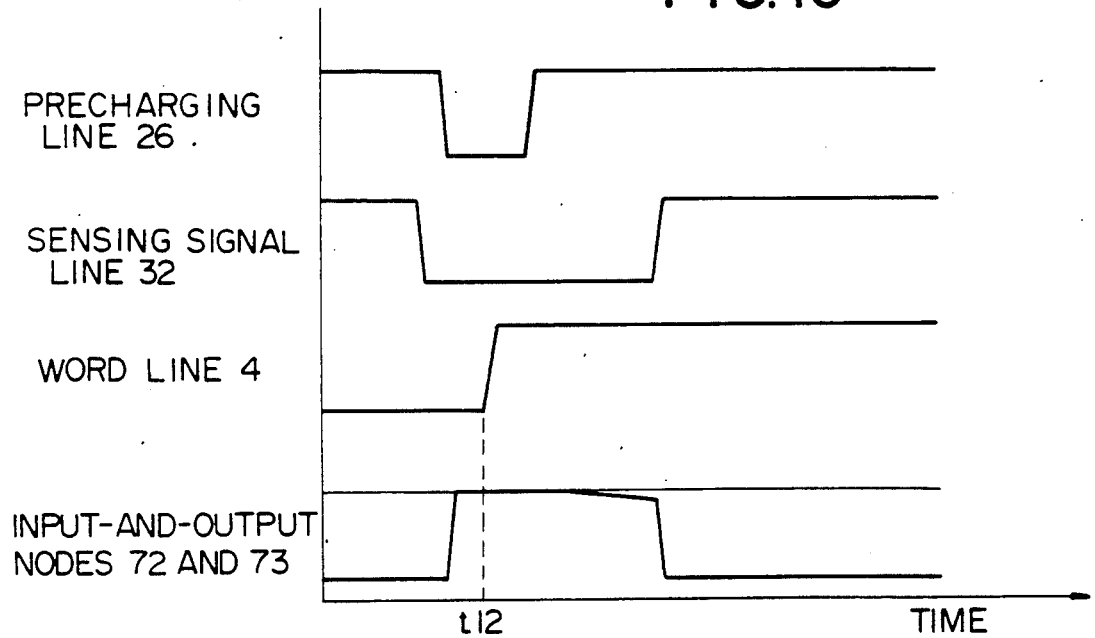
FIG. 10 is a diagram showing the waveforms of the essential signals in the semiconductor memory device shown in FIG. 9.
Figure 9:
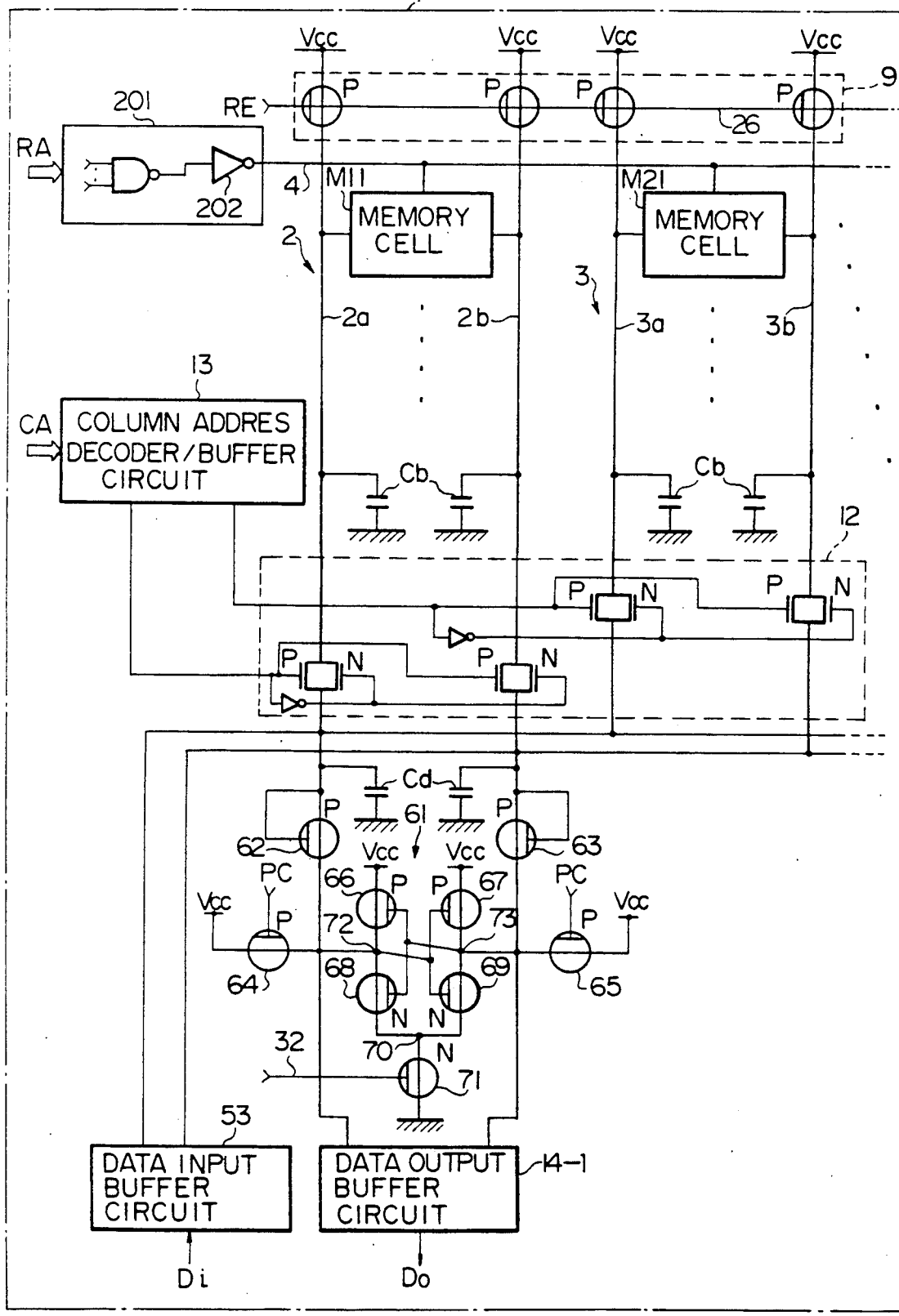
FIG. 9 is a circuit diagram showing the arrangement of still another semiconductor memory device embodying the present invention.

Turning to FIG. 9 of the drawings, still another semiconductor memory device is fabricated on the semiconductor substrate 50, and the semiconductor memory device is similar in circuit arrangement to that shown in FIG. 5 with the exception of a row address decoder-and-buffer circuit 201 and the precharging circuit 9. The row address decoder-and-buffer circuit 201 has a buffer section formed by inverter circuits 202, and the precharging circuit 9 is activated with a read enable signal RE on the precharging line 26. Then, the word line 4 goes up to the positive high voltage level Vcc at time t12, however, the circuit behavior is similar to that of the semiconductor memory device shown in FIG. 5. The waveforms of the essential signals are illustrated in FIG. 10.

Although particular embodiments of the present invention have been shown and described, it will be obvious to those skilled in the art that various changes and modifications may be made without departing from the spirit and scope of the present invention.

What is claimed is:

1. A semiconductor memory device comprising a) a plurality of memory cells arranged in rows and columns and respectively storing data bits each in the form of a difference in voltage level, b) a plurality of bit line pairs respectively coupled to the memory cells of said columns and propagating the data bits stored therein each in the form of the difference in voltage level, c) a plurality of word lines respectively coupled to the memory cells of said rows, d) a word line selecting circuit responsive to a row address signal and activate one of said word lines for allowing said data bits to be read out from or writted into said memory cells of one of said rows, e) a main precharging circuit coupled between a source of constant voltage level and said bit line pairs for precharging the bit line pairs, f) a data line pair capable of propagating one of said data bits, said data line pair comprising of two data lines, g) a bit line selecting circuit responsive to a column address signal and operative to coupled one of said bit line pairs to said data line pair, and h) a sensing facility coupled to said data line pair and operative to increase the difference in voltage level for a data output facility, wherein said sensing facility comprises a sense amplifier circuit with two nodes respectively associated with said data lines, and blocking means having first and second field effect transistors respectively coupled between said nodes and said data lines and operative to transfer the difference in voltage level to the nodes, said first and second field effect transistors having respective gate electrodes coupled to drain nodes thereof, said drain nodes being coupled to said data lines, respectively, said blocking means further being operative to electrically isolate one of the nodes from one of the data lines when said one of the nodes is different in voltage level from said one of the data lines of the data line pair, said sensing facility further comprising auxiliary precharging means coupled between said source of constant voltage level and the nodes, said main precharging circuit and said auxiliary precharging means being simultaneously activated in the presence of a precharging signal.

2. A semiconductor memory device comprising a) a plurality of memory cells arranged in rows and columns and respectively storing data bits each in the form of a difference in voltage level, b) a plurality of bit line pairs respectively coupled to the memory cells of said columns and propagating the data bits stored therein each in the form of the difference in voltage level, c) a plurality of word lines respectively coupled to the memory cells of said rows, d) a word line selecting circuit responsive to a row address signal and activate one of said word lines for allowing said data bits to be read out from or writted into said memory cells of one of said rows, e) a main precharging circuit coupled between a source of constant voltage level and said bit line pairs for precharging the bit line pairs, f) a write-in data line pair having first and second data lines and capable of propagating a data bit in the form of a difference in voltage level, g) a read-out data line pair having third and fourth data lines and capable of propagating one of said data bits, h) a column selecting circuit responsive to a column address signal and operative to coupled one of said bit line pairs to said write-in data line pair in a write-in operation, said column selecting circuit further being operative to coupled one of said bit line pairs to said read-out data line pair in a read-out operation, and i) a sensing facility coupled to said read-out data line pair and operative to increase the difference in voltage level for a data output facility, wherein said sensing facility comprises a sense amplifier circuit with two nodes respectively associated with said third and fourth data lines, and blocking means coupled between said nodes and said read-out data line pair and operative to transfer the difference in voltage level to the nodes, said blocking means further being operative to isolate one of the nodes from one of the read-out data line pair when said one of the nodes is different in voltage level from one of the third and fourth data lines associated therewith, said sensing facility further of constant voltage level and said nodes, said main precharging circuit and said auxiliary precharging means being simultaneously activated in the presence of a precharging signal.

3. A semiconductor memory device as set forth in claim 2, in which said blocking means has first and second grounded-gate field effect transistors respectively coupled between said nodes and said third and fourth data lines.

* * * * *

UNITED STATES PATENT AND TRADEMARK OFFICE
CERTIFICATE OF CORRECTION

PATENT NO. : 5,058,072
DATED : October 15, 1991
INVENTOR(S) : Masahiko Kashimura It is certified that error appears in the above-identified patent and that said Letters Patent is hereby corrected as shown below:

Col. 3, line 31, delete "out put" and insert --output--;

Col. 7, line 45, delete "WE" and insert --$W_E$--;

Col. 8, line 10, delete "biassing" and insert --biasing--;

Col. 9, line 13, delete "writted" and insert --written--;

Col. 9, line 18, delete "comprising" and insert --comsisting--;

Col. 10, line 10, delete "writted" and insert --written--.

Signed and Sealed this

Fifth Day of October, 1993

Attest:

BRUCE LEHMAN

Attesting Officer  Commissioner of Patents and Trademarks